(12) United States Patent
Hiroki et al.

(10) Patent No.: US 9,138,901 B2
(45) Date of Patent: Sep. 22, 2015

(54) TRANSFER DEVICE, SUBSTRATE PROCESSING SYSTEM AND POSTURE CONTROL UNIT

(75) Inventors: Tsutomu Hiroki, Yamana (JP); Toshinao Kato, Shizuoka (JP)

(73) Assignees: TOKYO ELECTRON LIMITED, Tokyo (JP); SANKYO SEISAKUSHO CORPORATION, Tokyo (JP)

(*) Notice: Subject to any disclaimer, the term of this patent is extended or adjusted under 35 U.S.C. 154(b) by 136 days.

(21) Appl. No.: 13/823,180

(22) PCT Filed: Sep. 14, 2011

(86) PCT No.: PCT/JP2011/070951
§ 371 (c)(1),
(2), (4) Date: May 1, 2013

(87) PCT Pub. No.: WO2012/036189
PCT Pub. Date: Mar. 22, 2012

(65) Prior Publication Data
US 2013/0216335 A1    Aug. 22, 2013

(30) Foreign Application Priority Data

Sep. 16, 2010  (JP) .................................. 2010-208406

(51) Int. Cl.
| | | |
|---|---|---|
| *B25J 9/10* | (2006.01) | |
| *B25J 18/04* | (2006.01) | |
| *H01L 21/677* | (2006.01) | |

(52) U.S. Cl.
CPC ..... *B25J 18/04* (2013.01); *B25J 9/107* (2013.01); *H01L 21/67742* (2013.01)

(58) Field of Classification Search
CPC ............ B25J 9/107; B25J 9/042–9/045; B25J 15/0273

USPC ............ 414/744.5, 744.6, 749.6, 751.1, 935, 414/941; 901/17; 74/490.01, 490.05, 74/490.06
See application file for complete search history.

(56) References Cited

U.S. PATENT DOCUMENTS 5,180,276 A * 1/1993 Hendrickson ............... 414/752.1
5,915,840 A * 6/1999 Zaguroli et al. ................. 384/53
(Continued)

FOREIGN PATENT DOCUMENTS

| JP | 03-297042 A | 12/1991 |
|---|---|---|
| JP | 04-129685 A | 4/1992 |
| JP | 05-055127 A | 3/1993 |
| JP | 06-015592 A | 1/1994 |

(Continued)

OTHER PUBLICATIONS

International Search Report for PCT/JP2011/070951 dated Dec. 13, 2011.

*Primary Examiner* — Saul Rodriguez
*Assistant Examiner* — Ronald Jarrett
(74) *Attorney, Agent, or Firm* — Pearne & Gordon LLP

(57) ABSTRACT

A transfer device can control a posture of a holding table accurately and prevent the holding table from wobbling even when the holding table is moved at a high speed. A first posture holding link 56 and a second posture holding link 57 are provided at the transfer device. One end of the first posture holding link 56 and one end of the second posture holding link 57 are rotatably connected to a connecting shaft 53. Rails 51 and 52 are fastened to a base plate 27 of the holding table 21. Rollers 54 and 55 are connected to the connecting shaft 53 to be rotated about an axis line. The rollers 54 and 55 are in contact with roller driving portions 51a and 52a. When the holding table 21 is moved, the rollers 54 and 55 are rotated on the roller driving portions 51a and 52a.

12 Claims, 14 Drawing Sheets

(56) References Cited

U.S. PATENT DOCUMENTS

| | | | |
|---|---|---|---|
| 6,648,508 B1* | 11/2003 | Brunk et al. | 384/57 |
| 8,267,636 B2* | 9/2012 | Hofmeister et al. | 414/744.5 |
| 2001/0004852 A1* | 6/2001 | Mitsuyoshi | 74/490.01 |
| 2001/0012483 A1 | 8/2001 | Kono et al. | |

FOREIGN PATENT DOCUMENTS

| | | | |
|---|---|---|---|
| JP | 07-504128 | A | 5/1995 |
| JP | 11-313477 | A | 11/1999 |
| JP | 2000-332081 | A | 11/2000 |
| JP | 2001-185596 | A | 7/2001 |

* cited by examiner

FIG. 3
(a)
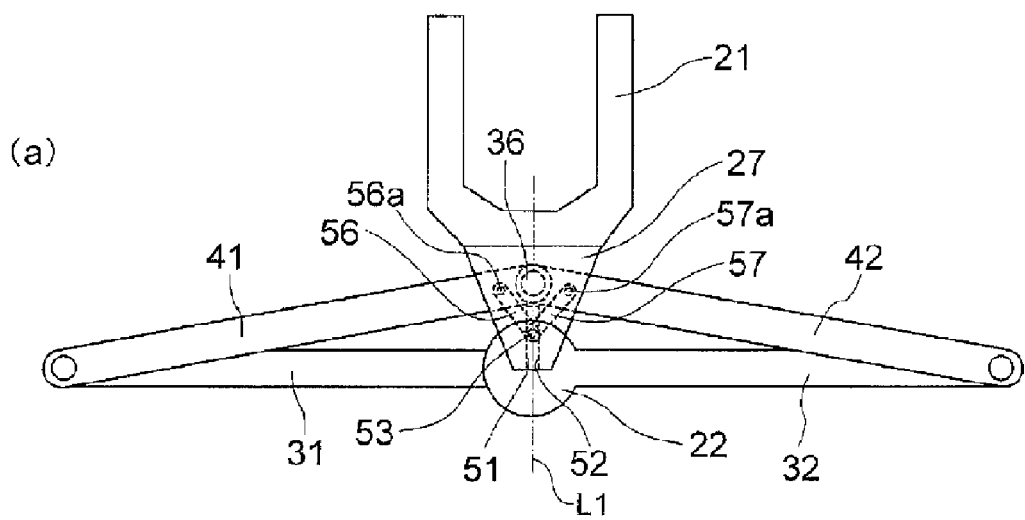
(b)
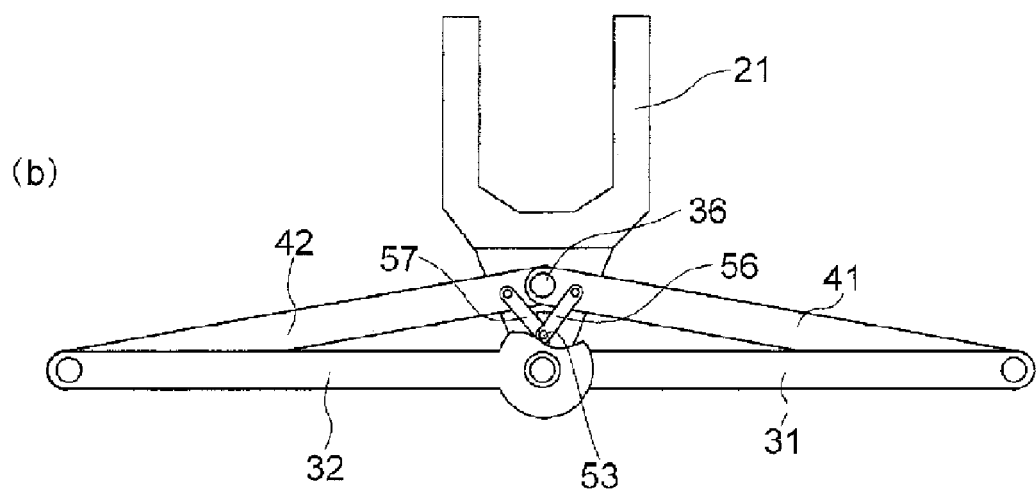

IX-IX CROSS SECTION

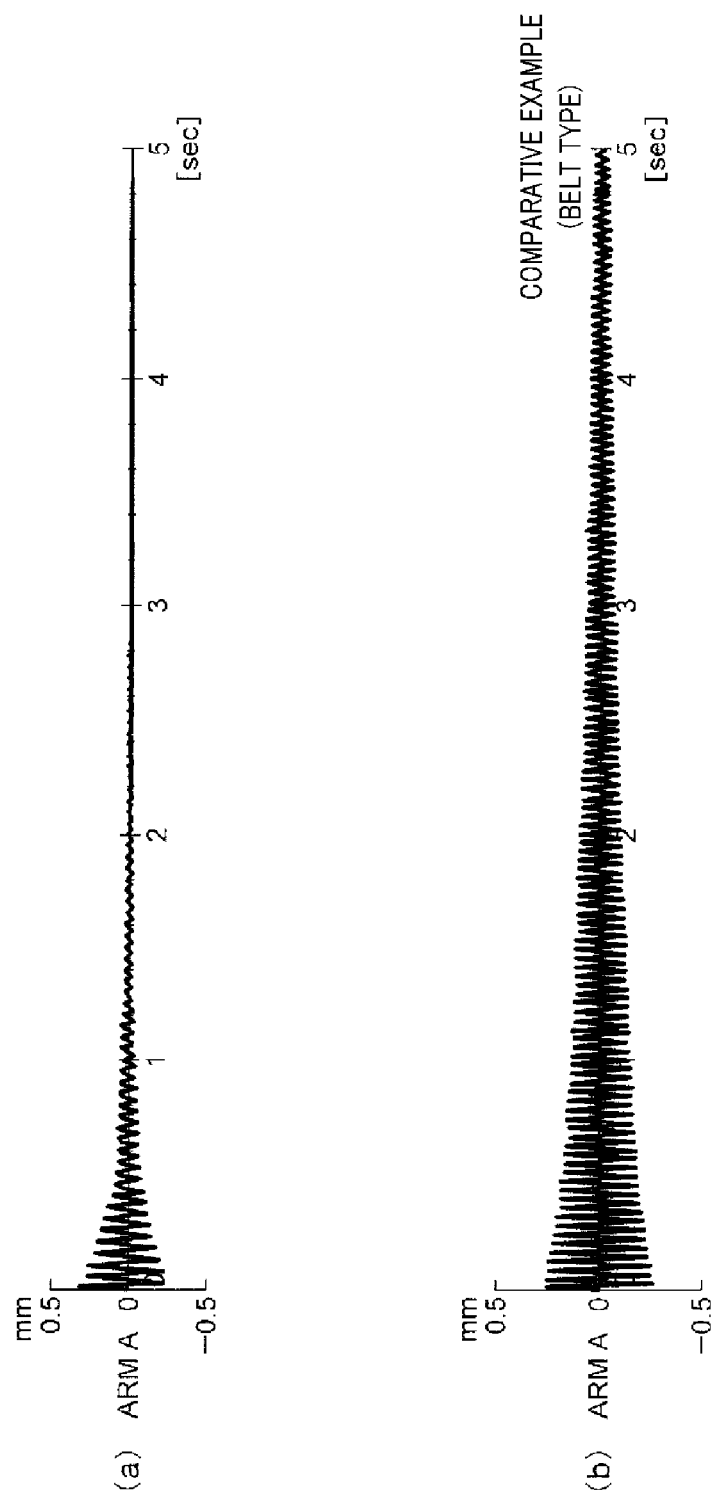

TRANSFER DEVICE, SUBSTRATE PROCESSING SYSTEM AND POSTURE CONTROL UNIT

CROSS-REFERENCE TO RELATED APPLICATION

This Application is a U.S. national phase application under 35 U.S.C. §371 of PCT Application No. PCT/JP2011/070951 filed on Sep. 14, 2011, which claims the benefit of Japanese Patent Application No. 2010-208406 filed on Sep. 16, 2010, the entire disclosures of which are incorporated herein by reference.

TECHNICAL FIELD

The present disclosure relates to a transfer device configured to transfer a target object; and, more particularly, to a transfer device configured to transfer a processing target object such as a semiconductor wafer, a liquid crystal substrate or an organic EL device into a processing chamber.

BACKGROUND ART

Various kinds of processes such as film formation, etching, oxidation and diffusion are performed on a processing target object such as a semiconductor wafer or a liquid crystal substrate. These processes are performed in a processing chamber. There exist various types of transfer devices configured to load the processing target object into the processing chamber or unload it from the processing chamber. Especially, a multi-joint robot that extends and contracts like frog's legs is widely used. Since such a frog-leg type multi-joint robot does not use a timing belt, it has high resistance against high vacuum and heat.

Patent Document 1 describes a frog-leg type multi-joint robot. The frog-leg type multi-joint robot has four links (two driving arms and two links) assembled in a rhombus shape. The two driving arms are connected to a central hub to be rotated about the central hub. One end of each of the two links is rotatably connected to a leading end of each of the two driving arms, respectively. Further, the other end of each of the two links is rotatably coupled to a plate-shaped holding table for holding thereon a processing target object. In this frog-leg type multi-joint robot, by rotating the two driving arms in opposite directions, the holding table is moved away from or close to the central hub in a radial direction.

In the frog-leg type multi-joint robot, only with the configuration where the holding table is rotatably connected to the leading ends of the two links, the holding table cannot have a stable posture. In order for the holding table to have the stable posture, a gear is fastened to a connecting shaft of the leading end of each of the two links. The two gears fastened to the two connecting shafts are engaged with each other, and the two links are allowed to be moved synchronously. With this configuration, the holding table fastened to the leading ends of the two links can have a stable posture.

Patent Document 2 describes another example frog-leg type multi-joint robot. In the multi-joint robot described in Patent Document 2, in order to control the posture of the holding table, steel belts instead of gears are wounded around two connecting shafts in a cross shape. By the steel belts, the two connecting shafts are synchronized to rotate in opposite directions. Accordingly, the holding table fastened to the leading ends of two links can have a stable posture.

Another example frog-leg type multi-joint robot is described in Patent Document 3. In this frog-leg type multi-joint robot, a direction maintaining unit is added to four links assembled in a rhombus shape in order to control the posture of the holding table.

The direction maintaining unit includes a direction setting arm shaft fastened to the holding table. The direction setting arm shaft is elongated toward a central hub from the holding table. The direction setting arm shaft is provided between a pair of guide magnets and held by a repulsive force therebetween. When the holding table is moved away from the central hub or close to the central hub in a radial direction, the direction setting arm shaft is moved in its axial direction with respect to the pair of guide magnets while still maintained between the pair of guide magnets. Accordingly, the holding table fastened to the direction setting arm shaft can have a stable posture. Further, in Patent Document 3, it is also mentioned that a shaft and a ball spline configured to be rotatable or slidable on the shaft may be used instead of the direction setting arm shaft and the guide magnets.

Patent Document 1: Japanese Patent Laid-open Publication No. H06-015592
Patent Document 2: Japanese Patent Laid-open Publication No. H07-504128
Patent Document 3: Japanese Patent Laid-open Publication No. H11-313477 (see paragraphs [0108] to [0115] and FIG. 7)

DISCLOSURE OF THE INVENTION

Problems to be Solved by the Invention

In the posture control unit using the engagement of the gears as described in Patent Document 1, however, a backlash (a gap between teeth that are engaged with each other) may be inevitably generated. This backlash may cause an error in a rotational angle of the connecting shafts to which the gears are fastened. Further, the posture of the holding table can be deviated.

In the posture control unit using the steel belts as described in Patent Document 2, although such a backlash may not be generated, the steel belts in the cross shape have low strength. Thus, if the holding table is moved at a high speed, the steel belts would be extended or contracted, so that the holding table is wobbled.

The direction maintaining unit described in Patent Document 3 also has a problem in that the posture of the holding table could not be controlled accurately only by the repulsive force between the magnets. Even if the ball spline is used instead of the magnets, a gap may be generated between the shaft and the ball spline. Thus, due to the gap, the posture of the holding table may not be controlled accurately.

In order to eliminate the gap between the shaft and the ball spline, it may be considered to set a minus gap between the shaft and the ball spline and apply a pre-load to the ball spline. If the pre-load is applied, however, a multiple number of balls mounted on the ball spline as rolling members may be made to take sliding motions, rather than rotational motions. In such a case, there may occur a new problem that particles may be easily generated caused by the sliding of the balls.

In view of the foregoing problems, the present disclosure provides a transfer device capable of controlling a posture of a holding table accurately and preventing the holding table from wobbling even when the holding table is moved at a high speed.

Means for Solving the Problems

In accordance with one aspect of an illustrative embodiment, there is provided a transfer device including a first arm configured to be rotated about a first axis line; a second arm configured to be rotated about the first axis line or a second axis line located at a different position from the first axis line; a first link whose one end is rotatably connected to a leading end of the first arm; a second link whose one end is rotatably connected to a leading end of the second arm; a holding table rotatably connected to the other ends of the first link and the second link and configured to hold thereon a transfer target object; a first posture holding link whose one end is rotatably connected to the first link; a second posture holding link whose one end is rotatably connected to the second link; a connecting shaft configured to connect the other ends of the first posture holding link and the second posture holding link; a roller provided at one of the holding table and the connecting shaft and configured to be rotated about an axis line; and a roller driving portion provided at the other of the holding table and the connecting shaft and configured to allow the roller to be rotated thereon. When the first arm and the second arm are rotated, the holding table is moved away from or close to the first axis line or the second axis line, and when the first arm and the second arm are rotated, the roller in contact with the roller driving portion is rotated on the roller driving portion.

In accordance with another aspect of the illustrative embodiment, there is provided a transfer device that is provided in a vacuum chamber and transfers a processing target object. Here, the transfer device includes a first arm configured to be rotated about a first axis line; a second arm configured to be rotated about the first axis line or a second axis line located at a different position from the first axis line; a first link whose one end is rotatably connected to a leading end of the first arm; a second link whose one end is rotatably connected to a leading end of the second arm; a holding table rotatably connected to the other ends of the first link and the second link and configured to hold thereon a transfer target object; a first posture holding link whose one end is rotatably connected to the first link; a second posture holding link whose one end is rotatably connected to the second link; a connecting shaft configured to connect the other ends of the first posture holding link and the second posture holding link; a roller provided at one of the holding table and the connecting shaft and configured to be rotated about an axis line; and a roller driving portion provided at the other of the holding table and the connecting shaft and configured to allow the roller to be rotated thereon. When the first arm and the second arm are rotated, the holding table is moved away from or close to the first axis line or the second axis line, and when the first arm and the second arm are rotated, the roller in contact with the roller driving portion is rotated on the roller driving portion.

In accordance with still another aspect of an illustrative embodiment, there is provided a posture control unit for use in a frog-leg type substrate transfer device including a first arm that is rotated about a first axis line; a second arm that is rotated about the first axis line or a second axis line located at a different position from the first axis line; a first link having one end rotatably connected to a leading end of the first arm; a second link having one end rotatably connected to a leading end of the second arm; and a holding table rotatably connected to the other ends of the first link and the second link and configured to hold thereon a transfer target object. Further, the posture control unit includes a first posture holding link whose one end is rotatably connected to the first link; a second posture holding link whose one end is rotatably connected to the second link; a connecting shaft configured to connect the other ends of the first posture holding link and the second posture holding link; a roller provided at one of the holding table and the connecting shaft and configured to be rotated about an axis line; and a roller driving portion provided at the other of the holding table and the connecting shaft and configured to allow the roller to be rotated thereon. When the first arm and the second arm are rotated, the roller in contact with the roller driving portion is rotated on the roller driving portion.

Effect of the Invention

In accordance with the illustrative embodiment, the posture of the holding table is controlled by using the rotational motion of the roller that is contact with the roller driving portion without a gap. Thus, a wobble of the holding table due to the gap may not occur, and the posture of the holding table can be controlled accurately. Further, since the roller and the roller driving portion come into line-contact with each other, the guide can be firmly performed. Thus, even when the holding table is moved at a high speed, the holding table may not be wobbled (vibrated). Moreover, even when the contact surface pressure between the roller and the roller driving portion is increased, a rotational motion of the roller is maintained, and a sliding motion of the roller may be suppressed as compared to the case of using a ball. Thus, it is possible to prevent particles due to the sliding motion from being generated.

BRIEF DESCRIPTION OF THE DRAWINGS

FIG. 3 provides diagrams illustrating the transfer device in an initial state (FIG. 3(*a*) is a plane view and FIG. 3(*b*) is a bottom view).

FIG. 14(*b*) illustrates an example where positions of the rotational center of arms are different; FIG. 14(*c*) illustrates an example where two picks are provided at one side of a central hub; and FIG. 14(*d*) illustrates an example where two frog-leg type transfer devices are vertically arranged in two levels and a total number of four frog-leg type transfer devices are provided).

FIG. 15 are graphs showing damping characteristics (FIG. 15(a) shows a damping characteristic of the illustrative embodiment and FIG. 15(b) shows a damping characteristic of a comparative example).

BEST MODE FOR CARRYING OUT THE INVENTION

Figure 1:
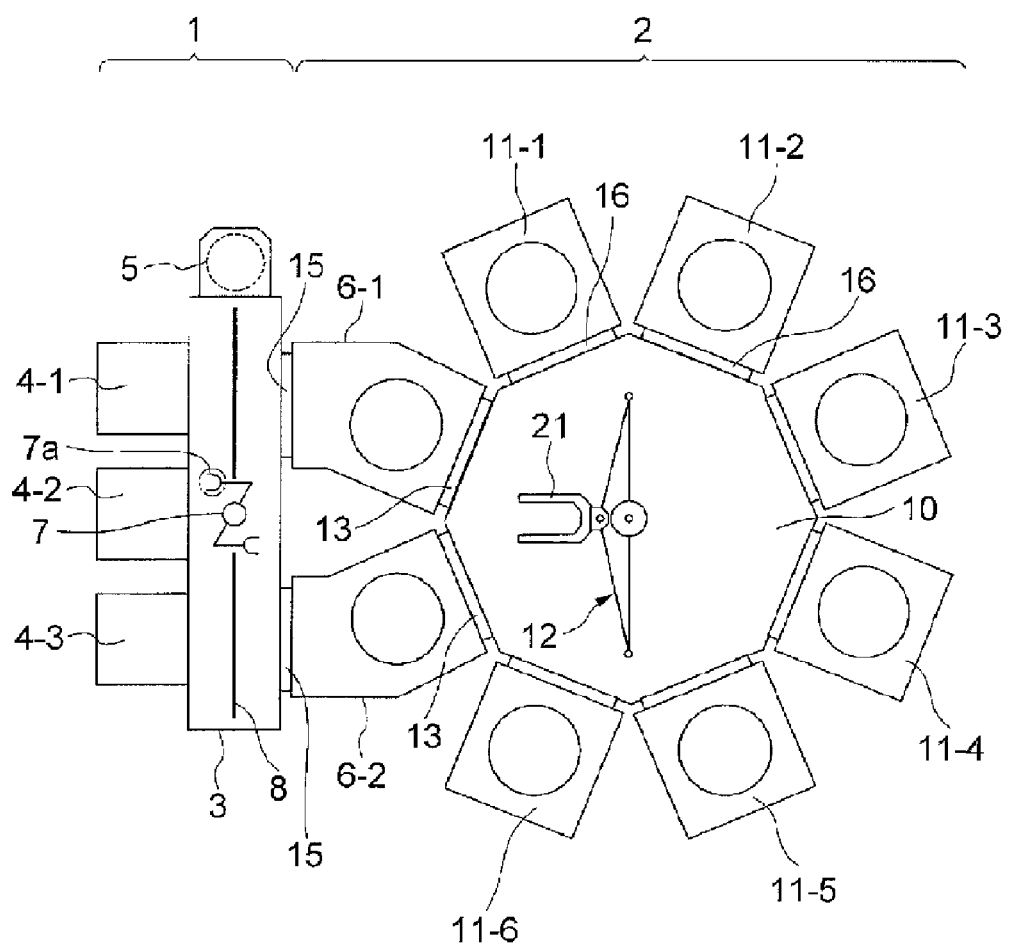
FIG. 1 is a plane view of a semiconductor device manufacturing system (cluster platform).

Hereinafter, a transfer device in accordance with an illustrative embodiment will be described with reference to the accompanying drawings. FIG. 1 is a plane view of a semiconductor device manufacturing system called a cluster platform. The semiconductor device manufacturing system includes a gate transferring system 1 and a processing system 2. The gate transferring system 1 includes an atmospheric transferring system (between 4-1 to 4-3, 3, and 6-1 to 6-2) that transfers a substrate under atmosphere; and a vacuum transferring system (between 6-1 to 6-2, 10, and 11-1 to 11-6) that transfers a substrate under vacuum. A semiconductor device manufacturing apparatus configured as the processing system 2 includes a multiple number of processing modules 11-1 to 11-6 as vacuum processing apparatuses, and performs various kinds of processes such as a plasma process on the substrate.

First, an overall configuration of the semiconductor device manufacturing system will be explained. The gate transferring system 1 includes a elongated loader module 3. Placed on ports 4-1 to 4-3 on a lateral side of the loader module 3 are cassette receptacles each of which accommodates therein a multiple number of substrates as processing target objects. An alignment device 5 configured to align a position of a substrate by sensing a notch of the substrate or the like is provided at an end portion of the loader module 3 in a lengthwise direction thereof. A multi-joint robot 7 configured to transfer substrates between the ports 4-1 to 4-3 and load lock chambers 6-1 and 6-2 is mounted in the loader module 3. The multi-joint robot 7 has a sliding shaft 8 to slide in the lengthwise direction of the loader module 3. The multi-joint robot 7 includes a pick 7a configured to hold a substrate thereon, and the pick 7a is moved in a vertical direction or in a horizontal direction to transfer the substrate. A non-illustrated FFU is disposed at a ceiling portion of the loader module 3. Within the loader module 3, clean air flows downward from the ceiling portion of the loader module 3 and is exhausted from a bottom surface of the loader module 3.

A polygonal transfer module 10 is disposed at a center of the processing system 2. The transfer module 10 may have a polygonal shape such as rectangle, hexagon or octagon depending on the number of process modules and arrangement thereof. A multiple number of process modules are radially arranged around the transfer module 10. Each process module 11 is configured to perform various processes such as film formation, etching, oxidation and diffusion on the substrate within a vacuum-evacuated processing chamber. A chamber of the transfer module 10 is also evacuated to vacuum. The transfer module 10 is connected to the load lock chambers 6-1 and 6-2. Each of the load lock chamber 6-1 and 6-2 is configured as a small room which is evacuated to vacuum and returned back to an atmospheric pressure repetitively. The transfer module 10 is connected to the process modules 11-1 to 11-6 via gate valves 16, and the transfer module 10 is also connected to the load lock chambers 3 via gate valves 13. Further, the load lock chambers 6-1 and 6-2 are connected to the loader module 3 via gate valves 15.

A transfer device 12 is mounted in the transfer module 10. The transfer device 12 receives an unprocessed substrate transferred into one of the load lock chambers 6-1 and 6-2 and delivers the received substrate into the transfer module 10. Then, the transfer device 12 transfers the substrate into a process module 11. The substrate may be processed in series or may be processed in parallel in the multiple number of process modules 11-1 to 11-6. When processing the substrate in series, the transfer device 12 transfers the substrate into at least two of the process modules 11-1 to 11-6, and then, different kinds of processes (serial processes) are performed on the substrate. Thereafter, the transfer device 12 carries the substrate into the other one of the load lock chambers 6-1 and 6-2. Meanwhile, when processing substrates in parallel, at least two of the process modules 11-1 to 11-6 are configured to perform the same process. The transfer device 12 transfers a substrate into one of the at least two of the process modules 11-1 to 11-6 that perform the same process. Then, the transfer device 12 does not transfer the substrate into the other process modules 11-1 to 11-6, but carries the substrate back into the other one of the load lock chamber 6-1 and 6-2. In order to perform the same process at the same time in the at least two of the process modules 11-1 to 11-6 configured to perform the same process, the transfer device 12 transfers substrates into the at least two process modules 11-1 to 11-6 in parallel.

The transfer device 12 includes a pick 21 configured as a holding table that holds thereon a wafer substrate. In this illustrative embodiment, the transfer device 12 has only one pick 21. However, in order to improve throughput, the transfer device 12 may have two or more picks 21.

The transfer device 12 is also configured to rotate a substrate on a horizontal plane and to move the substrate straightly in a radial direction within the vacuum chamber of the transfer module 10. The transfer device 12 first rotates the substrate on the horizontal plane to allow the substrate to be oriented toward one of the load lock chambers 6-1 and 6-2 or one of the process modules 11-1 and 11-6 that are arranged radially. Then, by moving the substrate straightly in the radial direction, the transfer device 12 transfers the substrate into one of the load lock chambers 6-1 and 6-2 or into one of the process modules 11-1 to 11-6.

The overall operation of the semiconductor device manufacturing system is as follows. First, the multi-joint robot 7 holds thereon a substrate accommodated in a cassette receptacle at the ports 4-1 to 4-3, and transfers the substrate into the alignment device 5. After the alignment device 5 aligns the substrate, the multi-joint robot 7 transfers the substrate into the load lock chamber 6-1. At this time, the inside of the load lock chamber 6-1 is under an atmospheric pressure.

Subsequently, the gate valve 15 of the load lock chamber 6-1 at a side of the loader module 3 is closed, and the load lock chamber 6-1 is depressurized by a non-illustrated exhaust device. Thereafter, the gate valve 13 is opened to allow the load lock chamber 6-1 to communicate with the transfer module 10 which has been depressurized by a non-illustrated exhaust device. The transfer device 12 disposed in the transfer module 10 receives the substrate from the load lock chamber 6 and transfers the substrate into the transfer module 10. Then, the transfer device 12 delivers the substrate into one of the process modules 11-1 to 11-6. The substrate is processed in the multiple number of process modules 11-1 to 11-6 in series or in parallel. Upon the completion of the process in the process modules 11-1 to 11-6, the transfer device 12 takes out the substrate from the process modules 11-1 to 11-6 and transfers the substrates into the load lock chamber 6-2.

Then, the gate valve 13 of the load lock chamber 6-2 is closed and the gate valve 15 thereof is opened, thus returning the inner pressure of the load lock chamber 6-2 back to the atmospheric pressure. The multi-joint robot 7 takes out the processed substrate from the load lock chamber 6-2 and returns the substrate back into the cassette receptacle at the ports 4-1 to 4-3 via the loader module 3.

Figure 2:
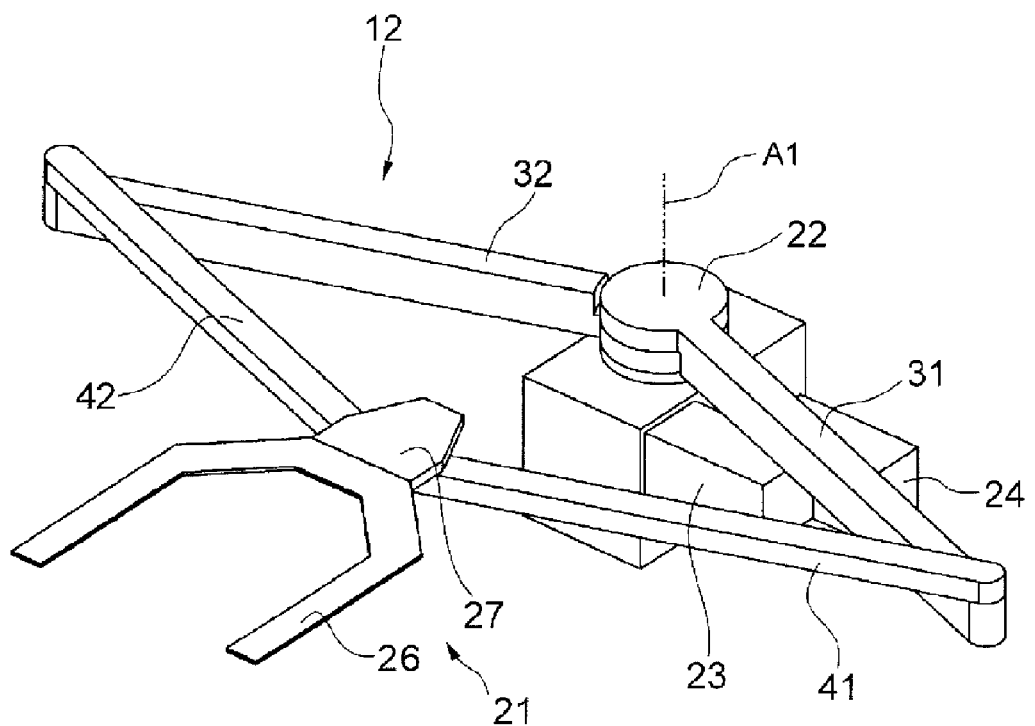
FIG. 2 is a perspective view of a transfer device in accordance with an illustrative embodiment.

FIG. 2 is a perspective view of the transfer device 12 disposed in the transfer module 10. The transfer device includes a first arm 31 configured to rotate about a central hub 22; and a second arm 32 configured to rotate about the central hub 22. One end of the first arm 31 is connected to the central hub 22 and is driven by a first motor 23 to rotate about a first axis line of the central hub 22. One end of the second arm 32 is connected to the central hub 22 and is driven by a second motor 24 to rotate about the first axis line of the central hub 22. Accurately, the central hub 22 has dual shafts that are concentrically arranged: inner solid shaft and outer hollow shaft. One of the first and second arms 31 and 32 is connected to one of the inner solid shaft and the outer hollow shaft, while the other one of the first and second arms 31 and 32 is connected to the other one of the inner solid shaft and the outer hollow shaft. The first and second arms 31 and 32 are configured to rotate about the first axis line A1 as a center of the central hub 22. The first and second motors 23 and 24 may be formed by a well-known direct drive motor, a motor with a reduction gear, or the like. The first and second motors 23 and 24 are configured to rotate the first and second arms 31 and 32, in opposite directions or in the same direction, respectively.

The pick 21 includes a U-shaped pick main body 26; and a base plate 26 to which the pick main body 26 is fastened. The pick main body 26 is fastened to the base plate 27 by, e.g., ball screws.

One end of a first link 41 and one end of a second link 42 are rotatably connected to the base plate 27 of the pick 21. The other end of the first link 41 is rotatably connected to a leading end of the first arm 31, and the other end of the second link 42 is rotatably connected to a leading end of the second arm 32. The pick 21, the first and second links 41 and 42 and the first and second arms 31 and 32 form a frog-leg type transfer device.

Figure 4:
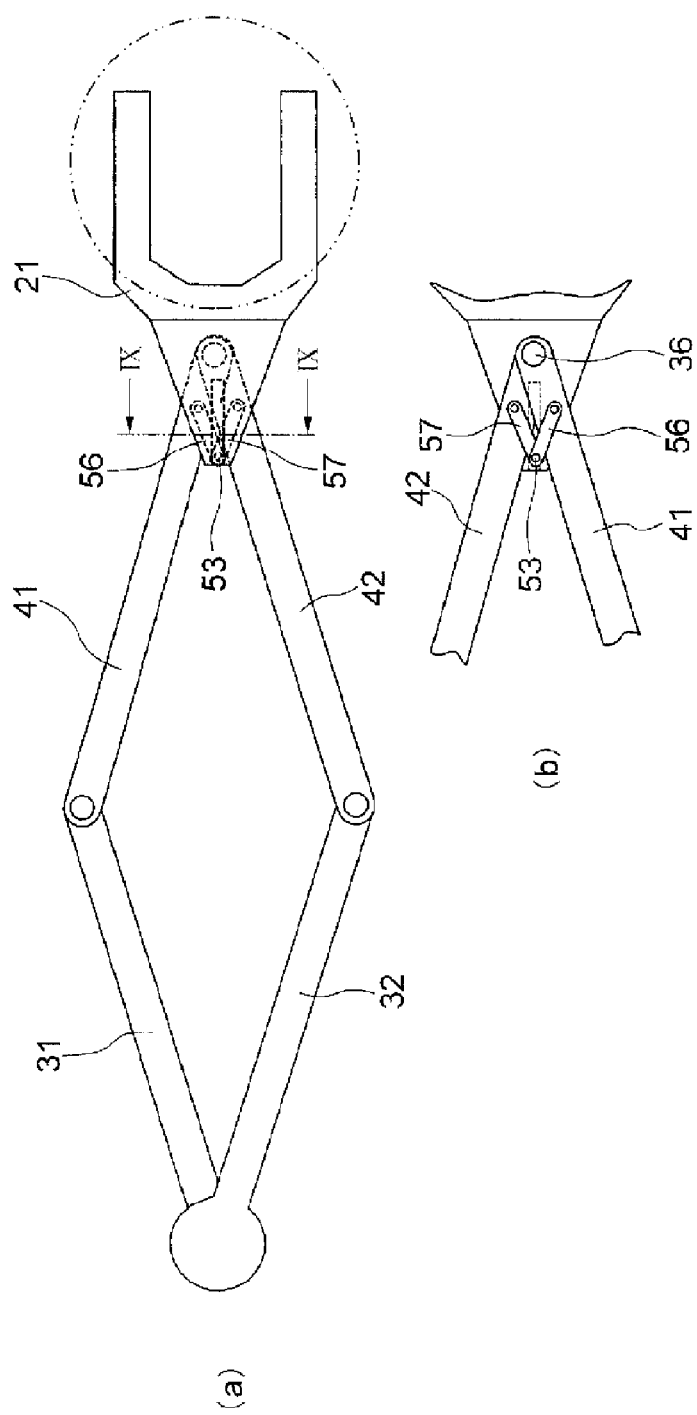
FIG. 4 provides diagrams illustrating the transfer device in an extended state (FIG. 4(*a*) is a plane view and FIG. 4(*b*) is a partial bottom view).

FIG. 3 illustrates an initial state of the frog-leg type transfer device (where an angle between the first arm and the second arm 32 is about 180 degrees). FIG. 4 illustrates an extended state of the frog-leg type transfer device. FIGS. 3(a) and 4(a) are plane views, and FIGS. 3(b) and 4(b) are bottom views.

In the initial state shown in FIG. 3, the frog-leg type transfer device is contracted. If the first and second arm 31 and 32 are rotated in opposite directions, the frog-leg type transfer device 12 is extended shown in FIG. 4. At this time, the pick 21 is distanced apart from the central hub 22 in a radial direction. Meanwhile, in the initial state shown in FIG. 3, if the first and second arms 31 and 32 are rotated in the same direction, the pick 21 is rotated about the central hub 22 while its position in the radial direction is constant.

Figure 5:
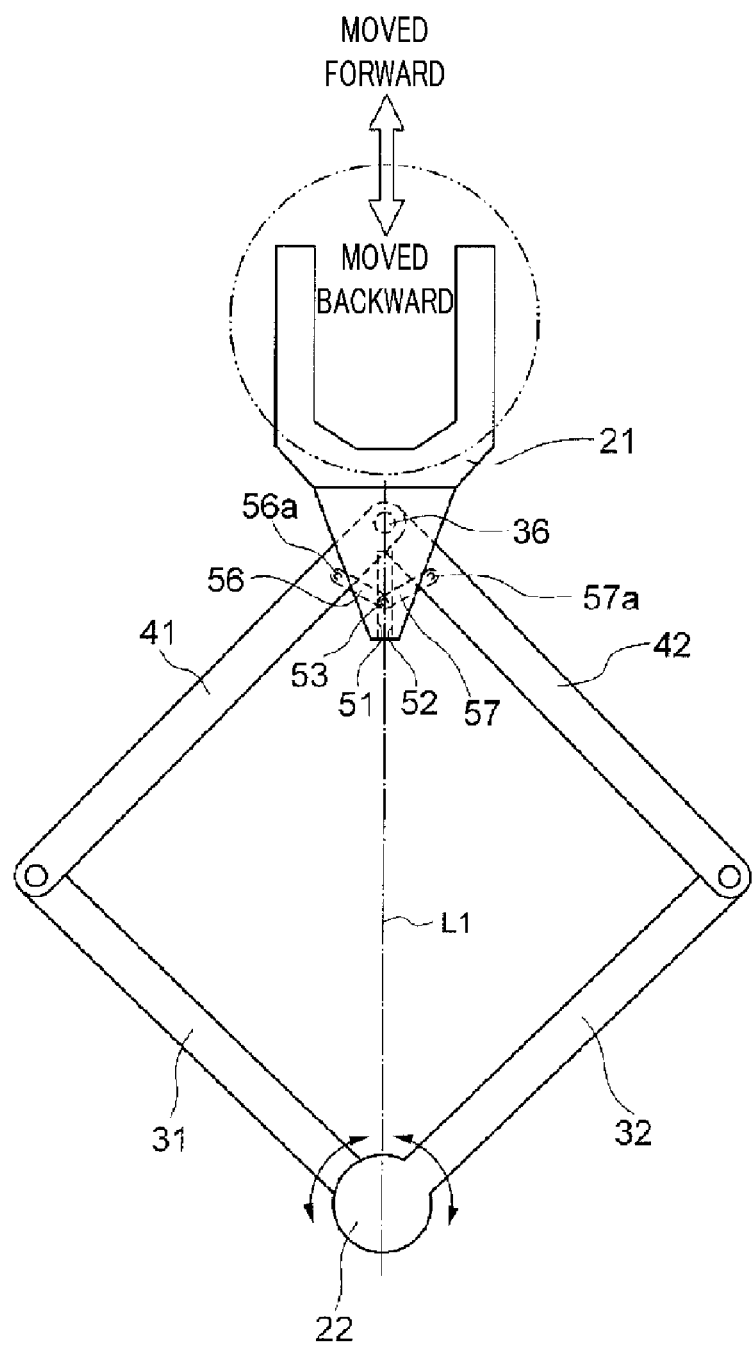
FIG. 5 is a schematic diagram of the transfer device.

As illustrated in FIGS. 3 and 4, the pick 21 is rotatably connected to leading ends of the first and second links 41 and 42. A shaft 36 that connects the first link 41 and the pick 21 rotatably also connects the second link 42 and the pick 21 rotatably. A posture control unit configured to control a posture of the pick 21 is provided in the vicinity of the leading ends of the first and second links 41 and 42. As depicted in FIG. 5, the posture control unit includes a first posture holding link 56 having one end 56a rotatably connected to the first link 41; a second posture holding link 57 having one end 57a rotatably connected to the second link 42; and a connecting shaft 53 that connects the other ends of the first posture holding link 56 and the second posture holding link 57 rotatably. Lengths of the first posture holding link 56 and the second posture holding link 57 are same. A length from the end 56a of the first posture holding link 56 to the shaft 36 is the same as a length from the end 57a of the second posture holding link 57 to the shaft 36. Accordingly, the connecting shaft 53 that connects the first and second posture holding links 56 and 57 is moved on a line L1 that connects centers of the shaft 36 and the central hub 22. Since the connecting shaft 53 is moved along rails 51 and 52 (to be described later in detail) provided at the pick 21, the pick 21 can have a stable posture. If the posture control unit is not provided, the posture of the pick 21 would not be controlled, since the pick 21 is rotated about the shaft 36 on a horizontal plane.

Figure 6:
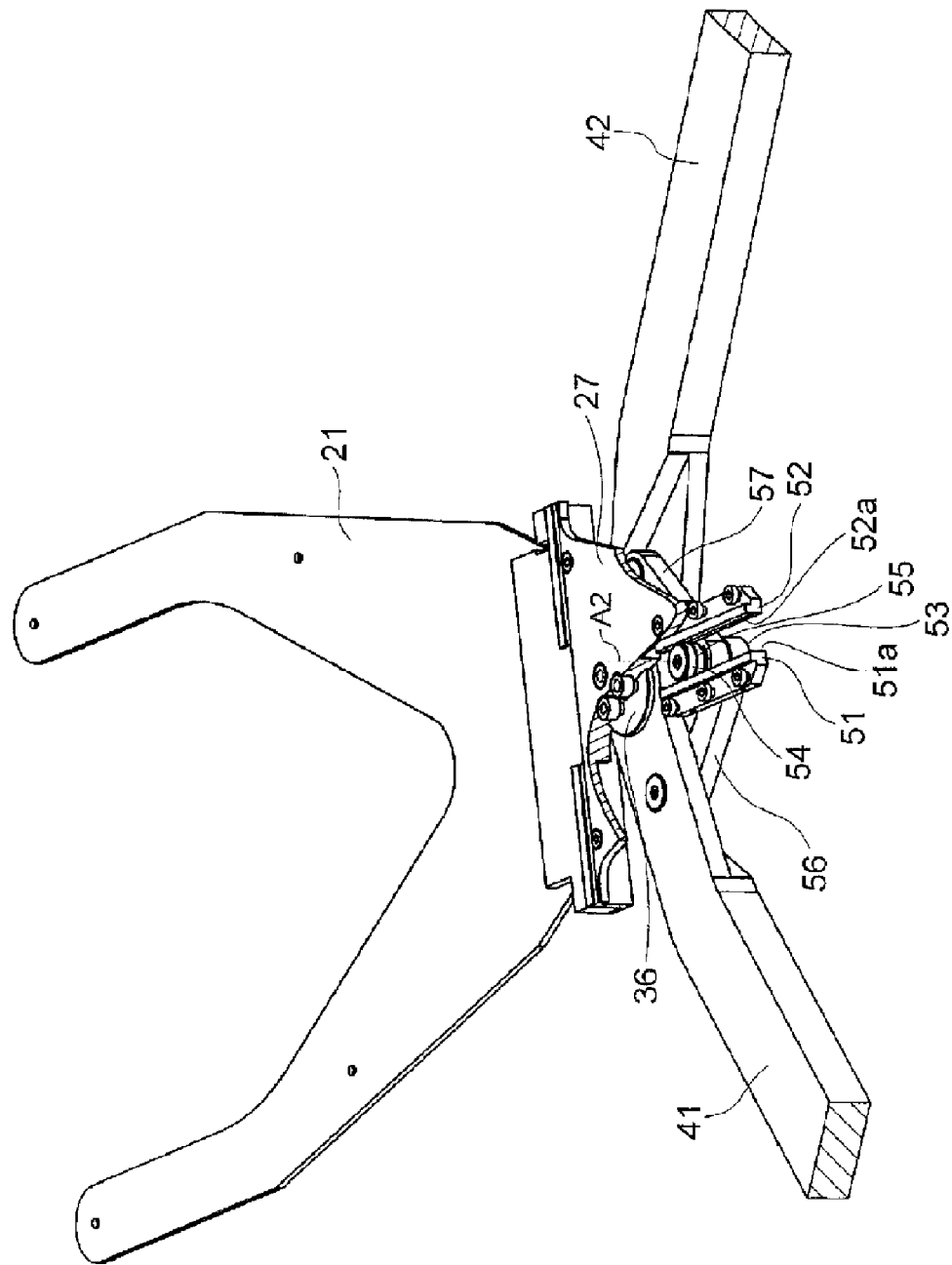
FIG. 6 is a perspective view of a posture control unit.
Figure 7:
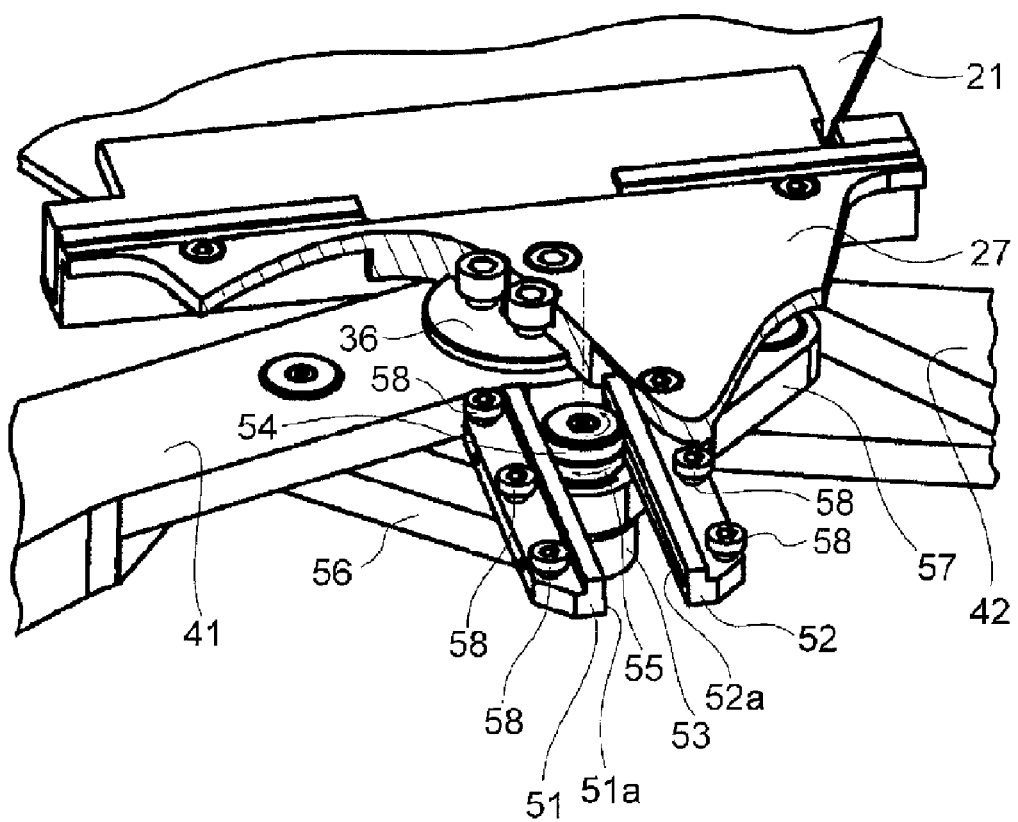
FIG. 7 is an enlarged perspective view of the posture control unit.

FIG. 6 is a perspective view of the posture control unit, and FIG. 7 is an enlarged perspective view thereof. The base plate 27 of the pick 21 is extended toward the central hub 22 (see FIG. 3). A pair of parallel rails 51 and 52 is fastened to a bottom surface of the base plate 27. The rails 51 and 52 are extended along the line L1 connecting the centers of the shaft 36 and the central hub (see FIG. 3). A pair of roller driving portions 51a and 52a is formed on inner surfaces of the rails 51 and 52, respectively, to be straightly extended in parallel to each other. A lower end side of one rail 51 is protruded slightly inward than an upper end side thereof, and the roller driving portion 51a is formed at the lower end side of the rail 51. An upper end side of the other rail 52 is protruded slightly inward than a lower end side thereof, and the roller driving portion 52a is formed at the upper end side of the rail 52. The roller driving portions 51a and 52a are formed at different positions in a vertical direction.

A pair of upper and lower rollers 54 and 55 is arranged in two levels in the vertical direction between the pair of rails 51 and 52. The upper and lower rollers 54 and 55 are configured to be rotatable about an axis line A2. In this illustrative embodiment, the upper and lower rollers 54 and 55 are connected to a connecting shaft 53 (see FIG. 9) to be described later. The rotational centers of the rollers 54 and 55 coincide with an axis line of the connecting shaft 53. The upper roller 54 is in contact with the roller driving portion 52a, and a load is applied to the roller driving portion 52a. The lower roller 55 is in contact with the roller driving portion 51a, and a load is applied to the roller driving portion 51a. The load applied between the upper roller 54 and the roller driving portion 52a is the same as the load applied between the lower roller 55 and the roller driving portion 51a. When the pair of upper and lower rollers 54 and 55 is moved along the pair of rails 51 and 52, the upper and lower rollers 54 and 55 are rotated in opposite directions. In this present illustrative embodiment, the roller driving portion and the roller are provided at the rail and the connecting shaft, respectively, but are not limited thereto. The roller may be provided at one of the base plate and the connecting shaft, and the roller driving portion may be provided at the other of the base plate and the connecting shaft.

Figure 8:
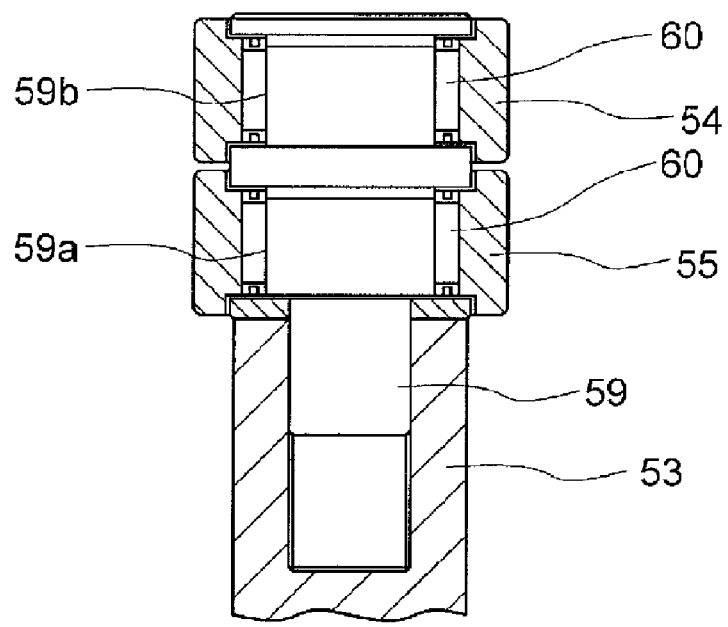
FIG. 8 is a cross sectional view illustrating a roller rotatably fastened to a stud.

Cam follower may be used as the rollers 54 and 55. That is, as illustrated in FIG. 8, a stud 59 is fastened to the connecting shaft 53, and lower and upper roller driving surfaces 59a and 59b are formed on the periphery of the stud 59. A multiple number of needle rollers 60 as rolling members are arranged on the lower roller driving surface 59a in a circumferential direction. The roller 55 has a cylindrical shape and is concentrically arranged with respect to the stud 59, surrounding the needle rollers 60. A multiple number of needle rollers 60 as rolling members are arranged on the upper roller driving surface 59b in the circumferential direction. The roller 54 has a cylindrical shape and is concentrically arranged with respect to the stud 59, surrounding the needle rollers 60. If the rollers 54 and 55 are rotated, the needle rollers 60 are also rotated between the stud 59 and the rollers 54 and 55.

As shown in FIGS. 6 and 7, a part of a lower side of the first link 41 is notched, and one end of the first posture holding link 56 is rotatably connected to the notched part. A part of an upper side of the second link 42 is notched, and one end of the second posture holding link 57 is rotatably connected to the notched part. Lengths of the first and second posture holding links 56 and 57 are same and shorter than a length of the first and second links 41 and 42. As described above, the distance from the shaft 36 to the one end 56a of the first posture holding link 56 is the same as the distance from the shaft 36 to the one end 57a of the second posture holding link 57 (see FIG. 5). The other ends of the first posture holding link 56 and the second posture holding link 57 are rotatably connected to the common connecting shaft 53 (see FIG. 5).

Figure 9:
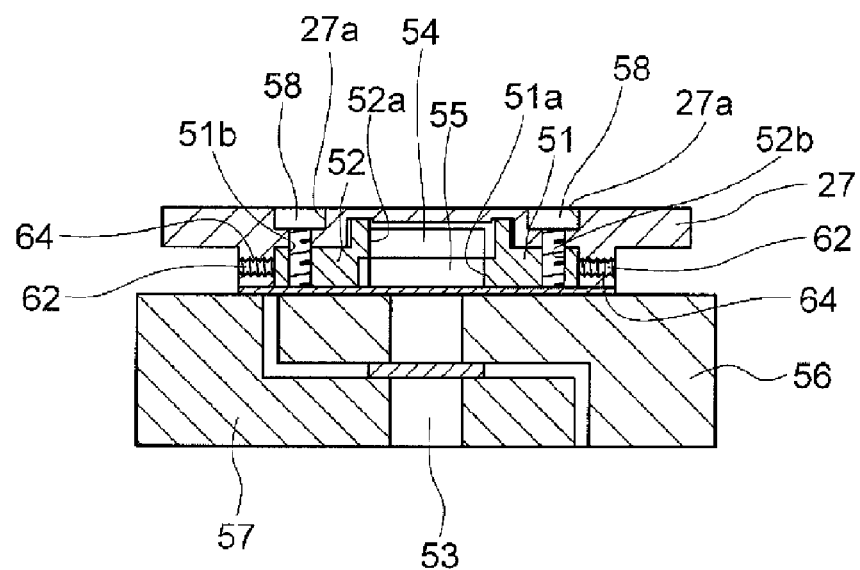
FIG. 9 is a cross sectional view (taken along an IX-IX line of FIG. 4) of the posture control unit.

FIG. 9 is a cross sectional view illustrating the posture control unit. As stated above, the other end of the first posture holding link 56 is rotatably connected to the connecting shaft 53. The other end of the second posture holding link 57 is also rotatably connected to the connecting shaft 53. The upper and lower rollers 54 and 55 are rotatably connected to the center line of the connecting shaft 53.

As depicted in FIG. 9, screw holes 51b and 52b are formed at the rails 51 and 52, respectively. Bolt insertion holes 27a corresponding to the screw holes 51b and 52b of the rails 51 and 52 are formed at the base plate 27 of the pick 21. By inserting bolts 58 into the screw holes 51b and 52b of the rails 51 and 52 through the bolt insertion hole 27a, respectively, the rails 51 and 52 can be fastened to the base plate 27.

The base plate 27 is provided with position adjusting screws 62 as position adjusting unit configured to adjust the positions of the rails 51 and 52. Horizontally elongated female screws 64 are formed at the base plate 27, and the position adjusting screws 62 formed of male screws are screwed into the female screws 64. By screwing the position adjusting screws 62, the amount of the advance and retreat of the rails 51 and 52 toward the rollers 54 and 55 can be adjusted, so that contact surface pressures between the roller 54 and the rail 51 and between the roller 55 and the rail 52 can be adjusted.

As shown in FIG. 3, the first and second links 41 and 42 and the first and second posture holding links 56 and 57 form a rhombus-shaped four-joint rotating chain, so that a frog-leg type posture control unit is implemented. If the frog-leg type transfer device is transformed from its initial state shown in FIG. 3 to the extended state shown in FIG. 4, the frog-leg type posture control unit is also changed from its initial state shown in FIG. 3 to the extended state in FIG. 4. The first and second posture holding links 56 and 57 have the same length. Further, the length from the shaft 36 to the one end 56a of the first posture holding link 56 is the same as the length from the shaft 46 to the one end 57a of the second posture holding link 57. As a result, the connecting shaft 53 is made to move straightly on the line L1 connecting the centers of the shaft 36 and the central hub 22. As mentioned above, the upper and lower rollers 54 and 55 are connected to the connecting shaft 53, and these rollers 54 and 55 are disposed between the pair of rails 51 and 52. With this configuration, the pick 21 fastened to the rails 51 and 52 can have a stable posture. When the connecting shaft 53 is moved straightly, the upper and lower rollers 54 and 55 are rotated in opposite directions on the roller driving portions 51a and 52b of the rails 51 and 52, respectively (see FIG. 7).

The following effect may be achieved by the posture control unit in accordance with the illustrative embodiment.

In accordance with the present illustrative embodiment, the posture of the pick 21 is controlled by using the rotational motions of the rollers 54 and 55 that are in firm contact with the roller driving portions 51a and 51b without a gap. Accordingly, wobbling of the pick 21 due to the gap may not be caused, so that the posture of the pick 21 can be controlled accurately. Further, since the pick 21 does not wobble, sliding or collision between the pick 21 and a substrate can be avoided. As a result, it is possible to prevent the substrate from being damaged.

Further, since the rollers 54 and 55 are in line-contact with the roller driving portions 51a and 51b, the connecting shaft 53 can be guided with high strength. Accordingly, even if the pick 21 is moved at a high speed, the pick 21 may not wobble (vibrate) on the horizontal plane. In accordance with the present illustrative embodiment, the speed of an extending/contracting motion of the transfer device can be improved to be about three times as high as the speed of an extending/contracting motion of a conventional frog-leg type transfer device. Further, the time taken for a single extending/contracting motion can be reduced from about 1 second to about 0.3 second. Although there is a limit in increasing the speed of the extending/contracting motion of the frog-leg type transfer device with a substrate held on the pick 21, the speed of the extending/contracting motion of the frog-leg type transfer device can be increased when the pick 21 does not hold a substrate thereon. Since the extending/contraction motion is repeated, an overall throughput of the semiconductor device manufacturing apparatus may be improved if the speed of the extending/contracting motion of the transfer device could be improved.

Further, strength in a vertical direction (Z axis) as well as the strength on the horizontal direction can also be improved. Data of FIG. 15 show damping characteristics (time taken until vibration stops) in the vertical direction (Z axis) when the first arm 31 and the second arm 32 are extended to the maximum (i.e., when the pick 21 is moved to a farthest position from the central hub 22). By irradiating laser to the pick 21 from a vertical direction, displacement of the pick 21 in the vertical direction is measured with the lapse of time. FIG. 15(a) shows a result of the present illustrative embodiment, and FIG. 15(b) shows a result of a comparative example (as described in Patent Document 2) where cross-shaped steel belts are used for the control of a posture of a pick). As shown in FIG. 15(b), in the comparative example, vibration of the pick in the vertical direction does not stop even after five seconds passes by. Meanwhile, in accordance with the present illustrative embodiment, as depicted in FIG. 15(a), vibration of the pick 21 is substantially stopped with the lapse of only one second. This effect is deemed to be obtained because energy in the vertical direction (Z axis) is also absorbed when the rollers 54 and 55 are rotated on the rails 51 and 52. In accordance with the present illustrative embodiment, since damping characteristic is good, it may be possible to transfer a substrate accurately immediately after the first and second arms 31 and 32 are extended to the maximum.

In accordance with the present illustrative embodiment, since the pick 21 does not wobble, a large-scale transfer device can be designed easily. Recently, there has been a demand for a large-size substrate having a diameter ranging from, e.g., about 300 mm to about 450 mm. As the size of the substrate increases, the weight of the substrate also increases. Thus, the transfer device is required to have higher strength. Further, when the transfer device is extended to the maximum, the length of the transfer device may become about 1.5 times larger, and, thus, the weight of the transfer device is increased. Therefore, a transfer error due to backlash and wobble may become increased.

Even when the contact surface pressures between the roller 54 and the roller driving portion 51a and between the roller 55 and the roller driving portion 52a are increased, the rotating motion of the rollers 54 and 55 is maintained. As compared to the case of using a ball, occurrence of a sliding motion is suppressed. Accordingly, it is possible to prevent particles due to the sliding motion from being generated.

By providing the upper and lower rollers 54 and 55 at the connecting shaft 53 and providing the pair of rails 51 and 52 at the pick 21, the posture control unit can be made compact and lightweight. Further, since the bending of a leading end of the frog-leg type transfer device can be reduced, the substrate can be aligned more accurately.

Figure 10:
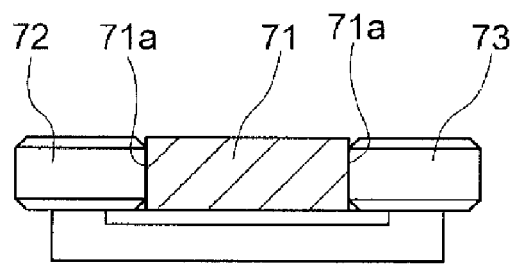
FIG. 10 is a cross sectional view illustrating another example roller and rail of the posture control unit.

FIG. 10 shows another example roller and rail. In this example, a single rail 71 is fastened to the pick 21, and roller driving portions 71a are formed on left and right lateral surfaces of the single rail 71. A pair of rollers 72 and 73 is disposed outside the rail 71 with the rail 71 therebetween. The rollers 72 and 73 are in contact with the roller driving portions 71a on the left and right lateral surfaces of the rail 71. Rotation centers of the pair of rollers 72 and 73 are parallel to the axis line of the connecting shaft 53. As in this example, the pair of rollers 72 and 73 may be disposed outside the pair of roller driving portions 71a.

Figure 11:
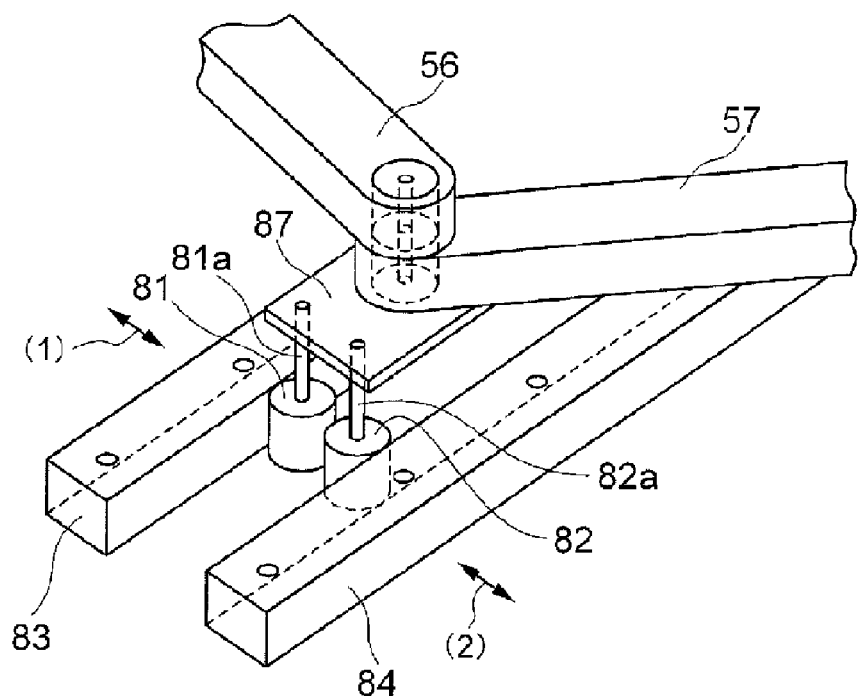
FIG. 11 is a perspective view illustrating still another example roller and rail of the posture control unit.

FIG. 11 illustrates still another example roller and rail. In this example, rollers 81 and 82 have separate rotational shafts 81a and 82a, respectively. The rotational shafts 81a and 82a are parallel to each other and fastened to a fixing plate 87 at different positions on a horizontal plane. The fixing plate 87 is rotatably connected to the first and second posture holding links 56 and 57. The two rollers 81 and 82 are disposed between two rails 83 and 84. The two rails 83 and 84 are parallel to each other and are connected to the base plate 27. The rail 83 is in contact with an outer peripheral surface of the roller 81. A pressure between the rail 83 and the roller 81 is controlled by adjusting a position of the rail 83 in directions (1) in FIG. 11. Likewise, the rail 84 is in contact with an outer peripheral surface of the roller 82, and a pressure between the rail 84 and the roller 82 is controlled by adjusting a position of the rail 84 in directions (2) of FIG. 11. Positions of the rollers 81 and 82 in a vertical direction are coincident, and positions of the rails 83 and 84 in the vertical direction are also coincident. In accordance with this example, since the two rollers 81 and 82 are not overlapped in the vertical direction, the posture control unit can be made thinner.

Figure 12:
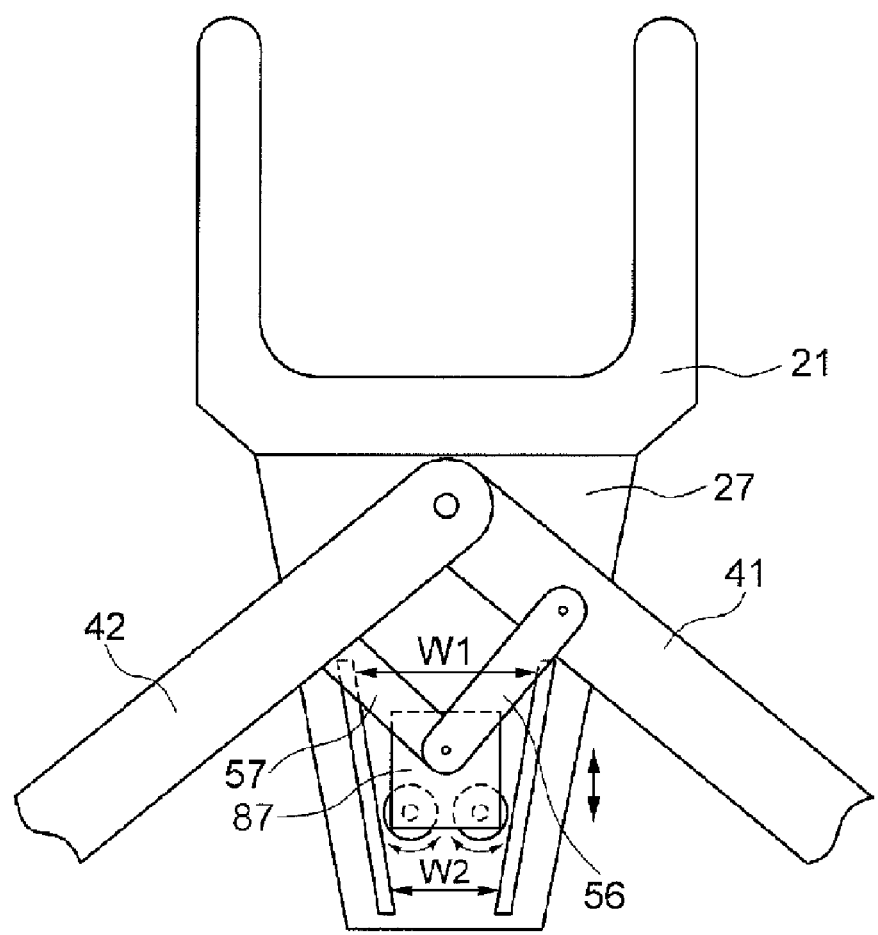
FIG. 12 is a plane view illustrating an example where rails of FIG. 11 are inclined.

FIG. 12 shows still another example where the rails 83 and 84 shown in FIG. 11 are inclined such that widths between the rails 83 and 84 are narrowed inwardly in a radial direction. That is, parallel rails are arranged in a "A" shape or a "V" shape. In accordance with the present illustrative embodiment, it is required to control the posture of the pick 21 with high strength at least when the first and second arms 31 and 32 are extended to the maximum. In this example, when the first and second arms 31 and 32 are extended to the maximum, the roller 81 comes into contact with the rail 83 at a high pressure and the roller also comes into contact with the rail 84 at a high pressure. Accordingly, the posture of the pick 21 can be controlled with high strength. Meanwhile, in other postures, since the pressure between the roller 81 and the rail 83 and the pressure between the roller 82 and the rail 84 are reduced, the pick 21 can be transferred at a high speed. In this way, by changing the shapes of the rails 83 and 84, the pick 21 can be designed to be moved freely. Further, a difference (W1−W2) in gaps W1 and W2 between the rails 83 and 84 may be set to be, e.g., about several μm. Moreover, in the present example, although the two separate rotational shafts are provided, the illustrative embodiment may not be limited thereto, but also be applicable to the configuration shown in FIG. 7 where only one rotational shaft is provided.

Figure 13:
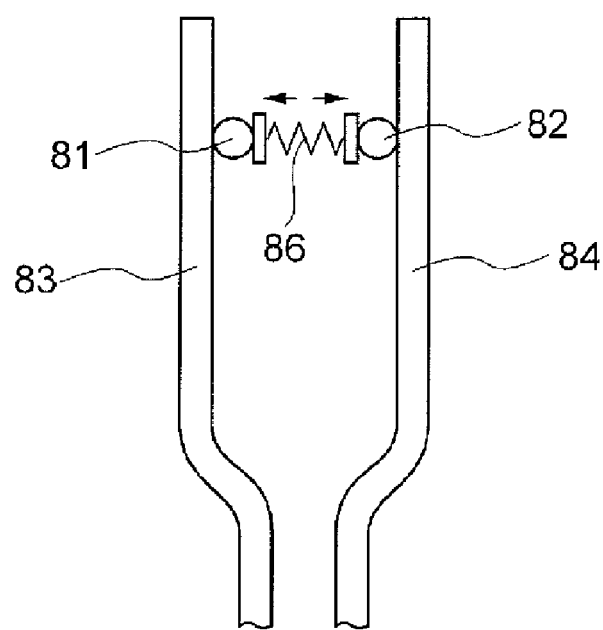
FIG. 13 is a plane view illustrating an example where rails of FIG. 11 are curved.

FIG. 13 illustrates still another example where the rails shown in FIG. 11 are curved and a coil spring 86 as an elastic body is disposed between the two rollers 81 and 82. The two parallel rails 83 and 84 are curved inwardly in a radial direction such that a distance between the two rails is shortened. Then, the two rails 83 and 84 become parallel to each other again. The coil spring 86 is disposed between the two rollers 81 and 82. Accordingly, even if the distance between the two rails 83 and 84 is changed, the roller 81 can be pressed against the rail 83, and the roller 82 can be pressed against the rail 84. In accordance with this example, when the first and second arms 31 and 32 are extended to the maximum, the roller 81 is pressed against the rail 83 at a high pressure, and the roller 82 is pressed against the rail 84 at a high pressure by the coil spring 86. Thus, the posture of the pick 21 can be controlled with high strength. Further, besides the coil spring 86, it may be also possible to use an elastic body such as a plate spring or rubber, a piezoelectric element, an air cylinder as a pressurizing member.

The above-described embodiment is for the purposes of illustration and is not intended to be limiting. Therefore, the illustrative embodiment can be modified in various ways without departing from the scope of the disclosure.

By way of example, the transfer device in accordance with the illustrative embodiment may be applied to a manufacturing apparatus for a FPD, an organic EL, a solar cell or the like without being limited to the semiconductor device manufacturing apparatus. Further, the transfer device of the present illustrative embodiment may also be applicable to an in-line semiconductor device manufacturing apparatus in which an inlet and an outlet for a substrate are separately provided.

In accordance with the above-described illustrative embodiment, the contact surface pressure between the roller and the rail is controlled by adjusting the position of the rail. However, it may be also possible to control the contact surface pressure between the roller and the rail by adjusting the position of the roller. If an eccentric cam follower is used as a roller, the position of the roller can be easily adjusted.

In the above-described embodiment, there are provided two rollers. However, the number of the rollers may not be limited thereto, but may be one or more than two. Further, the two roller driving portions are provided in the above-described embodiment. However, the number of the roller driving portions may not be limited thereto, but may be one or more than two.

The illustrative embodiment is not limited to the frog-leg type transfer device in which only one pick is provided and the first and second arms are rotated about the same center line (i.e., a so-called coaxial dual-shaft device). By way of example, the illustrative embodiment may also be applicable to frog-leg type transfer devices having other configurations as illustrated in FIGS. 14(a) to 14(d).

Figure 14:
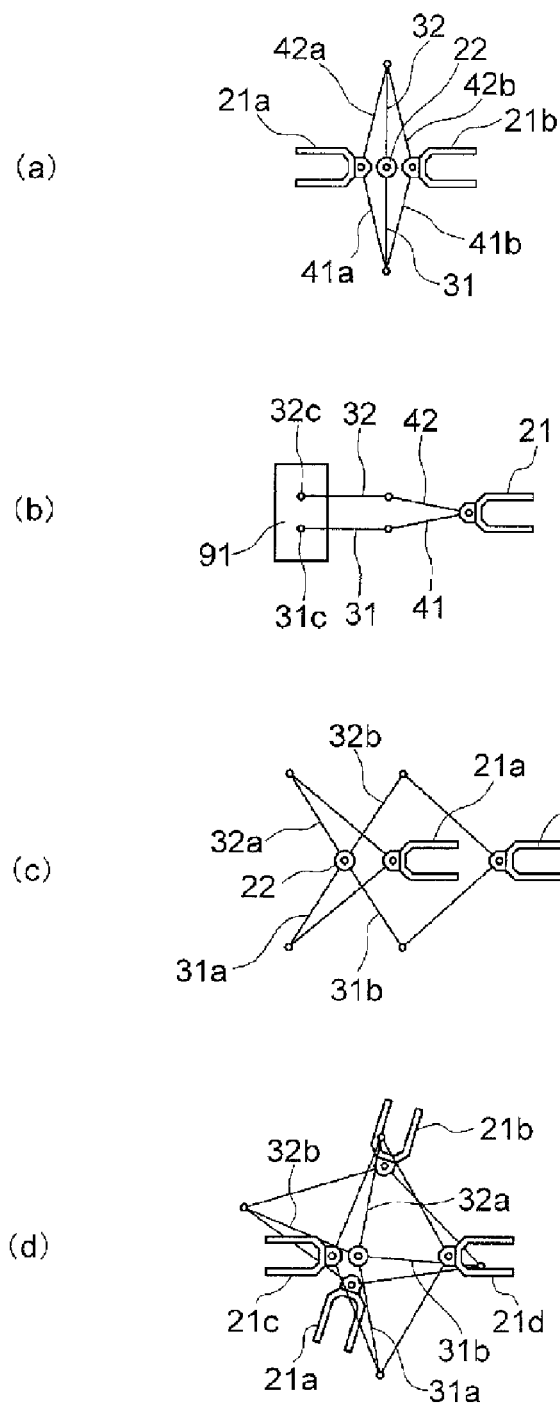
FIG. 14 provides diagrams illustrating examples of a frog-leg type transferring function to which the illustrative embodiment is applied (FIG. 14(*a*) illustrates an example where two frog-leg type transfer devices are provided.

FIG. 14(a) illustrates a configuration example where two picks 21a and 21b are provided around a central hub at an angular interval of about 180 degrees, and the two picks 21a and 21b are driven by two frog-leg type transfer devices. In this example, one pick 21a is rotatably connected to one end of each of a first link 41a and a second link 42a. The other end of the first link 41a is rotatably connected to a leading end of a first arm 31, and the other end of the second link 42a is rotatably connected to a leading end of a second arm 32. Further, the other pick 21b is rotatably connected to one end of each of a first link 41b and a second link 42b. The other end of the first link 41b is rotatably connected to the leading end of the first arm 31, and the other end of the second link 42b is rotatably connected to the leading end of the second arm 32. The two frog-leg type transfer devices are arranged apart from each other in a circumferential direction at an angular interval of about 180 degrees with respect to the central hub 22.

FIG. 14(b) illustrates a configuration example where a rotational center 31c of a first arm 31 and a rotational center 32c of a second arm 32 are located at different positions on a horizontal plane (i.e., which is not a so-called coaxial dual-shaft device). The first arm 31 is rotated about the rotational center 31c on a base 91, and the second arm 32 is rotated about the rotational center line 32c that lies at a different position from the first rotational center 31c on the same horizontal plane. As in this example, the rotational center 31c of the first arm and the rotational center 32c of the second arm may be located at different positions on the horizontal plane.

FIG. 14(c) illustrates a configuration example where two frog-leg type transfer devices are provided, and two picks 21a and 21b are arranged at one side (right side in the drawing) of a central hub 22. The two picks 21a and 21b are located at different positions in a vertical direction. In this example, a total number of two picks 21a and 21b and a total number of four arms 31a, 32a, 31b and 32b are provided. The four arms 31a, 32a, 31b and 32b are rotated by two driving shafts. As in this example, when providing two frog-leg type transfer devices, it may be possible to arrange the two picks 21a and 21b only at one side of the central hub 22.

FIG. 14(d) illustrates a configuration example where two frog-leg type transfer devices as shown in FIG. 14(a) are vertically arranged in two levels. In this example, a total number of four picks 21a to 21d and a total number of four frog-leg type transfer devices are provided. A total number of four arms 31a, 32a, 31b and 32b are rotated by four driving shafts.

The present disclosure is based on Japanese Patent Application No. 2010-208406 field on Sep. 16, 2010, the entire disclosures of which are incorporated herein by reference.

EXPLANATION OF CODES 11-1~11-6: Process module (Vacuum processing apparatus)
12: Transfer device
21, 21a, 21b: Pick (Holding table)
27: Base plate (Holding table)
22: Central hub (First axis line)
31: First arm
32: Second arm
41, 41a, 41b: First link
42, 42a, 42b: Second link
51,52: Pair of rail
51a, 52a: Pair of roller driving portion
53: Connecting shaft
54, 55: Pair of roller
56: First posture holding link
57: Second posture holding link
59: Stud
60: Needle roller

What is claimed is:
1. A transfer device comprising:
a first arm configured to be rotated about a first axis line;
a second arm configured to be rotated about the first axis line or a second axis line located at a different position from the first axis line;
a first link whose one end is rotatably connected to a leading end of the first arm;
a second link whose one end is rotatably connected to a leading end of the second arm;
a holding table rotatably connected to the other ends of the first link and the second link and configured to hold thereon a transfer target object;
a first posture holding link whose one end is rotatably connected to the first link;
a second posture holding link whose one end is rotatably connected to the second link;
a connecting shaft configured to connect the other ends of the first posture holding link and the second posture holding link;
a pair of rollers comprising a first roller and a second roller provided at the connecting shaft and configured to be rotated about an axis line; and
a pair of roller driving portions provided at the holding table and comprises a first roller driving portion in contact with the first roller, and a second roller driving portion in contact with the second roller, configured to allow the pair of rollers to be rotated thereon,
wherein when the first arm and the second arm are rotated, the holding table is moved away from or close to the first axis line or the second axis line,
when the first arm and the second arm are rotated, the roller in contact with the roller driving portion is rotated on the roller driving portion, and
the pair of roller driving portions are straightly elongated, and the pair of rollers are arranged between the pair of roller driving portions.

2. The transfer device of claim 1,
wherein
the pair of rollers are arranged between the pair of roller driving portions, and
when the first arm and the second arm are rotated, the pair of rollers are rotated on the pair of roller driving portions.

3. The transfer device of claim 2,
wherein the pair of rollers are disposed at the inside of the pair of roller driving portions and connected to the connecting shaft such that the pair of rollers are arranged on a common axis line and located at different positions in the common axis line direction, and
the pair of roller driving portions are formed at an inside of a pair of rails fastened to the holding table to be located at different positions on the common axis line.

4. The transfer device of claim 1 further comprising:
a position adjusting unit configured to adjust a position of at least one of the first and second rollers and the first and second roller driving portions to control a contact surface pressure between the roller and the roller driving portion.

5. The transfer device of claim 1,
wherein the pair of rollers is configured to be rotated about a stud connected to the one of the holding table and the connecting shaft, and
needle rollers as rolling members are provided between the stud and the roller.

6. The transfer device of claim 1,
wherein the first arm and the second arm are rotated about only the first axis line, and
in a plane view of the transfer device,
two sets each of which has the first link, the second link and the holding table are arranged to be spaced apart at an angular interval of about 180 degrees with respect to the first axis line in a circumferential direction, and
two sets each of which has the first posture holding link, the second posture holding link, the pair of roller driving portions and the pair of rollers are arranged to be spaced apart at an angular interval of about 180 degrees with respect to the first axis line in the circumferential direction.

7. A transfer device that is provided in a vacuum chamber and transfers a processing target object, the transfer device comprising:
   a first arm configured to be rotated about a first axis line;
   a second arm configured to be rotated about the first axis line or a second axis line located at a different position from the first axis line;
   a first link whose one end is rotatably connected to a leading end of the first arm;
   a second link whose one end is rotatably connected to a leading end of the second arm;
   a holding table rotatably connected to the other ends of the first link and the second link and configured to hold thereon a transfer target object;
   a first posture holding link whose one end is rotatably connected to the first link;
   a second posture holding link whose one end is rotatably connected to the second link;
   a connecting shaft configured to connect the other ends of the first posture holding link and the second posture holding link;
   a pair of rollers comprising a first roller and a second roller provided at the connecting shaft and configured to be rotated about an axis line; and
   a pair of roller driving portions provided at the holding table and comprises a first roller driving portion in contact with the first roller, and a second roller driving portion in contact with the second roller, configured to allow the pair of rollers to be rotated thereon,
   wherein when the first arm and the second arm are rotated, the holding table is moved away from or close to the first axis line or the second axis line,
   when the first arm and the second arm are rotated, the roller in contact with the roller driving portion is rotated on the roller driving portion, and
   the pair of roller driving portions are straightly elongated, and the pair of rollers are arranged between the pair of roller driving portions.

8. A substrate processing system configured to load a processing target object into a vacuum chamber by using the transfer device as claimed in claim 7.

9. A posture control unit for use in a frog-leg type substrate transfer device including a first arm that is rotated about a first axis line; a second arm that is rotated about the first axis line or a second axis line located at a different position from the first axis line; a first link whose one end is rotatably connected to a leading end of the first arm; a second link whose one end is rotatably connected to a leading end of the second arm; and a holding table rotatably connected to the other ends of the first link and the second link and configured to hold thereon a transfer target object, the posture control unit comprising:
   a first posture holding link whose one end is rotatably connected to the first link;
   a second posture holding link whose one end is rotatably connected to the second link;
   a connecting shaft configured to connect the other ends of the first posture holding link and the second posture holding link;
   a pair of rollers comprising a first roller and a second roller provided at the connecting shaft and configured to be rotated about an axis line; and
   a pair of roller driving portions provided at the holding table and comprises a first roller driving portion in contact with the first roller, and a second roller driving portion in contact with the second roller, configured to allow the pair of rollers to be rotated thereon,
   wherein when the first arm and the second arm are rotated, the roller in contact with the roller driving portion is rotated on the roller driving portion, and
   the pair of roller driving portions are straightly elongated, and the pair of rollers are arranged between the pair of roller driving portions.

10. The transfer device of claim 1,
   wherein the rotational axis line of the pair of rollers and a rotational axis line of the connecting shaft are in vertical directions relative to the holding table.

11. The transfer device of claim 10,
   wherein the pair of rollers and the connecting shaft are in a coaxial relationship.

12. The transfer device of claim 1,
   wherein when the first arm and the second arm are rotated, the pair of rollers are rotated on the pair of roller driving portions in opposite directions.

* * * * *